(12) United States Patent
King

(10) Patent No.: US 9,235,232 B2
(45) Date of Patent: Jan. 12, 2016

(54) ALL-WEATHER ENCLOSURE FOR FLAT PANEL DISPLAYS

(76) Inventor: Justin King, Longwood, FL (US)

(\*) Notice: Subject to any disclaimer, the term of this patent is extended or adjusted under 35 U.S.C. 154(b) by 791 days.

(21) Appl. No.: 13/551,564

(22) Filed: Jul. 17, 2012

(65) Prior Publication Data

US 2013/0192866 A1   Aug. 1, 2013

Related U.S. Application Data

(60) Provisional application No. 61/591,392, filed on Jan. 27, 2012.

(51) Int. Cl.
```
G02F 1/1333    (2006.01)
G06F 1/16      (2006.01)
G06F 1/18      (2006.01)
H04N 5/64      (2006.01)
G02F 1/1335    (2006.01)
```

(52) U.S. Cl.
CPC .............. *G06F 1/1601* (2013.01); *G06F 1/182* (2013.01); *H04N 5/64* (2013.01); *G02F 1/133608* (2013.01); *G02F 2001/133628* (2013.01)

(58) Field of Classification Search
CPC combination set(s) only.
See application file for complete search history.

(56) References Cited

U.S. PATENT DOCUMENTS

| | | | |
|---|---|---|---|
| 8,081,267 B2 | 12/2011 | Moscovitch et al. | |
| 8,102,483 B2 | 1/2012 | Perry et al. | |
| 2009/0231807 A1 | 9/2009 | Bouissiere | |
| 2010/0171889 A1* | 7/2010 | Pantel et al. | 349/1 |
| 2011/0216488 A1* | 9/2011 | Perry et al. | 361/679.01 |
| 2012/0039042 A1 | 2/2012 | Moscovitch et al. | |
| 2012/0092818 A1 | 4/2012 | Perry et al. | |
| 2012/0120625 A1 | 5/2012 | Moscovitch et al. | |

\* cited by examiner

*Primary Examiner* — Wen-Ying P Chen
(74) *Attorney, Agent, or Firm* — Altera Law Group, LLC

(57) ABSTRACT

A lightweight, weatherproof, protective enclosure for flat panel displays comprising a containing element in the form of an open, shallow rectangular prism with a regular network of shallow reinforcing depressions formed in its outer surface and a substantially transparent planar viewing element hingedly connected to the containing element such that when the viewing element is closed over, and sealed to, the containing element the protective enclosure forms a lightweight, monocoque structure with enhanced structural rigidity.

18 Claims, 3 Drawing Sheets

ALL-WEATHER ENCLOSURE FOR FLAT PANEL DISPLAYS

CROSS-REFERENCE TO RELATED APPLICATIONS

The present application derives benefit from U.S. Provisional App. No. 61/591,392 ("Improved All-Weather Enclosure for Flat Panel Displays") filed on Jan. 27, 2012.

FIELD OF THE INVENTION

The present invention relates to an improved all-weather enclosure for flat panel displays including flat panel televisions.

BACKGROUND OF THE INVENTION

Flat panel displays, including flat panel televisions, computer displays, and displays used for digital signage have become far less expensive in recent years leading to the deployment of such devices in a multitude of unconventional physical locations, including exterior locations where they are exposed to the elements. For example, it is not unusual for flat panel televisions be deployed in residential applications in the backyard near the family grill or overlooking the pool.

Unsurprisingly, products have been constructed to enclose these devices and shield them from the elements. Unfortunately, most have the same shortcomings, to wit: 1) They are made primarily of metal, metal and plastic, or even wood; and, 2) They are heavy, thus requiring that that they be mounted directly to a wall or other structure capable of bearing their weight and thus prohibiting their use with the standard ceiling and wall mounting systems commonly used to mount flat-panel displays today; and, 3) Because of the weight and complexity they are expensive.

To address these shortcomings, products constructed of lightweight plastic material have been developed. While such enclosures may be suitable for small flat-panel displays, when "scaled" to enclose the larger flat-panel displays now commonly available, such simple enclosures do not possess sufficient structural rigidity to adequately protect the flat-panel display. The principal difficulty arises because the use of readily available prefabricated light plastic material results in a relatively flimsy enclosure that deforms and warps easily, thus compromising the weatherproof nature of the enclosure. Moreover, because one large side of the enclosure must be constructed of some transparent material, such as polycarbonate, any warping of the enclosure also affects the optical clarity of the polycarbonate, thus distorting the image generated by the enclosed display. By using thicker, heavier plastic, such devices can be made with increased structural rigidity, but consequently such devices are heavier and more expensive to manufacture and mount.

Numerous alternative approaches have been disclosed. For example, products have been constructed that seek to increase the structural rigidity of the case by completely encasing the flat-panel display in a semi-permanently sealed box made of interlocking polycarbonate or plastic panels or the like. Such a device is disclosed by U.S. App. 2012/0120625. While certainly rigid, these devices are by no means lightweight. Other inventions disclose other types of semi-permanently sealed devices. Specifically, U.S. App. 2012/0039042 and U.S. App. 2012/0092818 both disclose devices in which the viewing element is adhesively sealed to the containing element and the flat-panel display is sealed within. While the inventions disclosed by U.S. Pat. No. 8,081,267 and U.S. Pat. No. 8,102,483 do not permanently seal the device within, they offer no easy means of ingress for maintenance or adjustment of the enclosed flat-panel display. These sealed devices are thus unsuitable for ordinary consumer and home use. To provide an improved means for ingress and access, U.S. App. 2009/0231807 discloses a device that has a flip-up front panel for accessing the flat-panel display within. Unfortunately, this device is constructed of a multitude of parts and is quite heavy thus making it impractical if not mounted directly to a wall. Today, flat-panel displays are mounted in a wide variety of locations, both directly attached to walls and "free-standing" hanging from ceiling mounts and wall mounts. Finally, all of the above inventions contain numerous constituent parts and are costly to manufacture.

Accordingly, one goal of the present invention is to provide a device to enclose and protect a flat-panel display that is both simple to manufacture, inexpensive, and lightweight and yet rigidly constructed such that it does not easily warp or deform. A second goal of the present invention is to provide a hinged transparent viewing panel thus providing a convenient means of accessing the interior of the enclosure to mount, adjust, and maintain the flat panel display mounted within. A third goal of the present invention is to ensure that the requisite transparent viewing pane remains planar and that the requisite elastomeric seal between the transparent viewing panel and the body of the device is continuously and evenly compressed between the viewing pane and the body of the device thus ensuring that the enclosed flat-panel display is completely protected from the elements.

BRIEF SUMMARY OF THE INVENTION

According to the preferred embodiment of the invention, a plastic housing for flat panel displays comprised of a front, planar viewing element and a rear, recessed containing element is disclosed.

The front, planar viewing element is constructed of substantially transparent polycarbonate or other suitable material and may include one or more non-reflective, anti-glare surfaces. Applied continuously to the inner aspect of the viewing element and along its outer edge is a sealing strip comprised of rubber or other elastomeric material. At the bottom edge of the viewing element are one or more regularly spaced knobs or similar, lifting means. Similarly, extending through the bottom edge of the viewing element are one or more compression key latches, or similar locking means.

The containing element is constructed of polystyrene, high-density polyethylene, or some similar substance and is generally in the form of a recessed shallow rectangular prism reinforced with a network of molded indentations formed in its outer surface. These molded indentations serve to increase the structural rigidity of the containing element. While these indentations are regularly spaced across the outer surface of the containing element, they are absent in the center portion of the back wall of the containing element to allow for drilled or molded holes used to secure the flat panel display and protective enclosure to a standard mounting device. Also, the lower wall of the containing element has one or more mating slots, molded indentations, or similar tang receiving means that interoperate with the locking tangs present on the compression key latches, or similar locking means, attached to the viewing element. The bottom wall of the containing element is perforated to allow access for power and signal cables. Similarly, the left and right sides of the containing element are perforated by one or more air vents.

The viewing element and containing element are attached at their respective tops by a continuous piano hinge, or equivalent hinging means. The viewing element swings down to close thus compressing the sealing strip attached to the containing element between the viewing element and the containing element. Inserted at regular intervals through the peripheral back of the containing element along its bottom and left and right sides are a multiplicity of threaded screws or studs that in turn protrude through concentric holes drilled or otherwise formed in the overlying sealing strip and the viewing element (when the latter is closed over the containing element). The viewing element is secured to the containing element by: 1) Screwing a threaded screw cap onto an each of the protruding threaded screws or studs extending above the plane of the viewing element; and, 2) Actuating the compression key latches, or similar locking means, such that their tangs interoperate with the mating slots, molded indentations, or similar tang receiving means, present in the bottom wall of the containing element. The process of screwing the threaded screw caps onto the protruding threaded screws of studs squeezes the sealing strip between the containing element and the viewing element thus serving to tension the reinforced containing element together with the viewing element to form a rigid, monocoque structure. Hinged prop rods, or a similar propping means, for holding the viewing element in the open, up position relative to the containing element, are provided on the inner aspect of the left and right sides of the viewing element adjacent to the left and right edges of the viewing element. To hold the viewing element in the up, open position the distal end of each prop rod is inserted in a mating hole in the upper edge of the adjacent side wall of the containing element. When closed, these prop rods are positioned unobtrusively inside the sealed unit so that they do not interfere with the flat panel display.

BRIEF DESCRIPTION OF THE DRAWINGS

These and other objects, advantages, and novel features of the present invention will be more readily appreciated from the following detailed description of a preferred embodiment thereof when read in conjunction with the accompanying drawings, in which.

DETAILED DESCRIPTION OF THE PREFERRED EMBODIMENT

Figure 1:
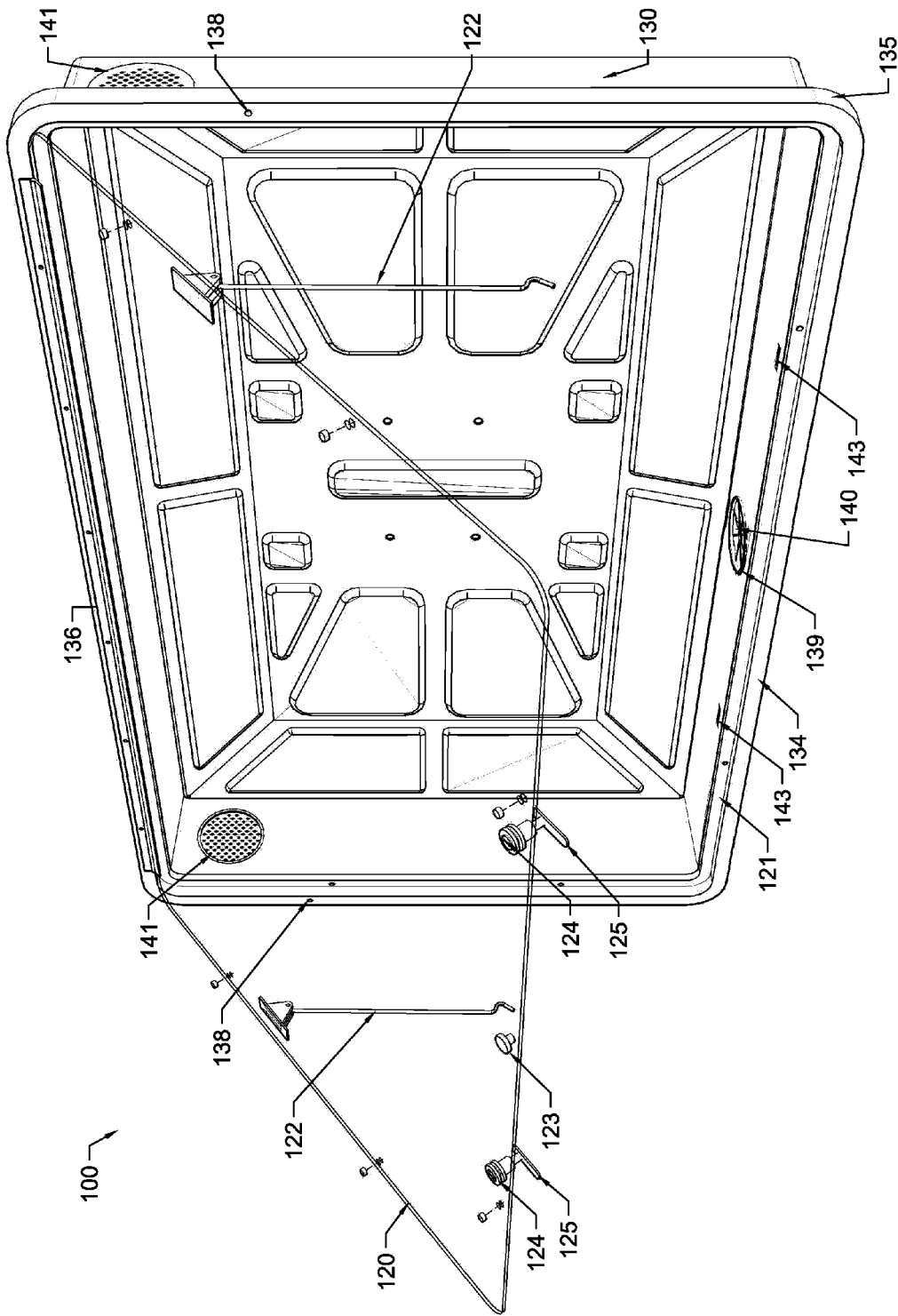
FIG. 1 illustrates an oblique, front view of the present invention with the viewing element partially open.
Figure 2:
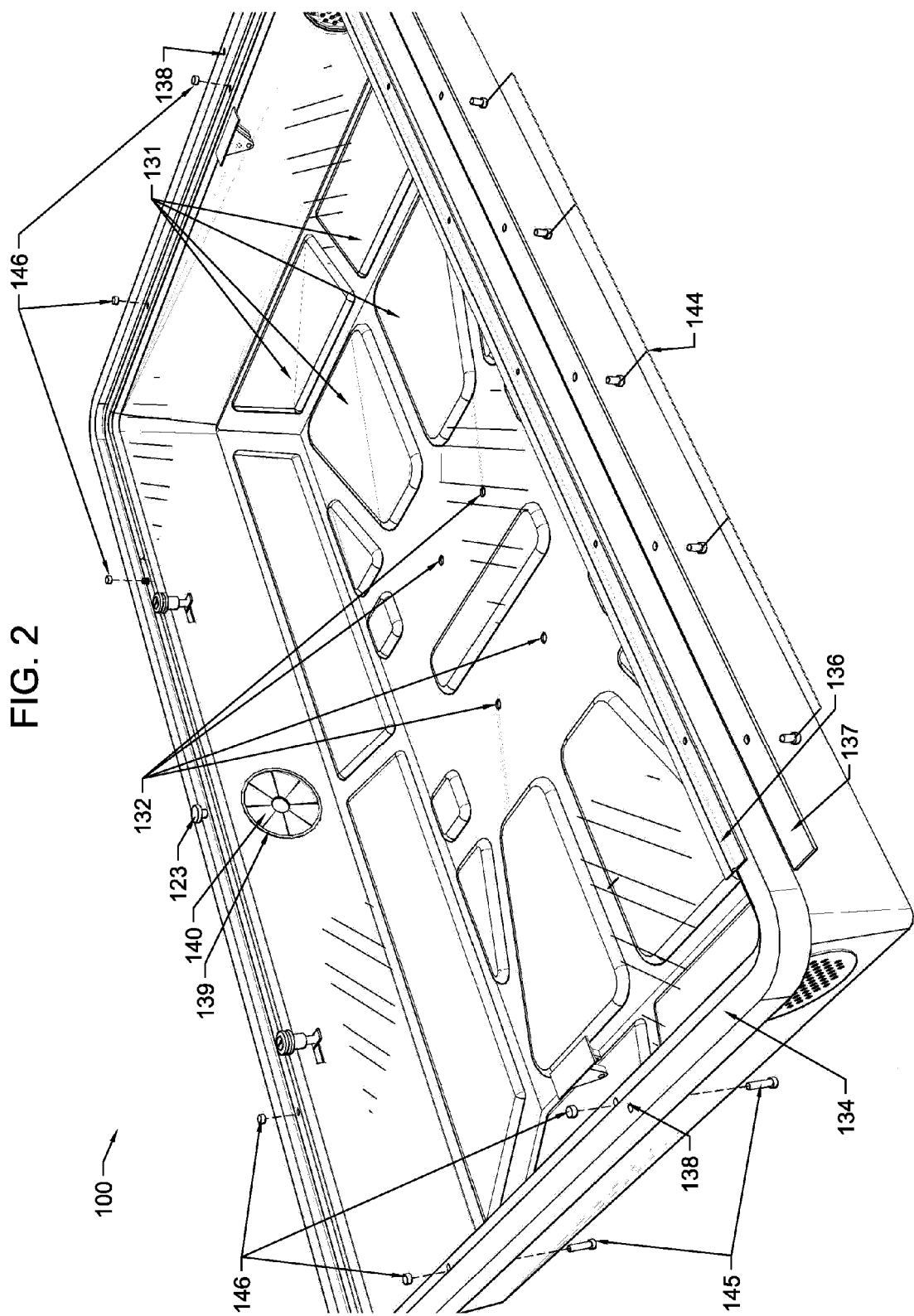
FIG. 2 illustrates a, oblique top and front view of the present invention with the viewing element closed and locked.

Referring now to FIGS. 1 and 2, a protective enclosure 100 used to enclose and protect a flat panel display, or equivalent, comprised of a front, planar viewing element 120 and a rear, recessed containing element 130 is disclosed.

The front, planar viewing element 120 is constructed of substantially transparent polycarbonate or other suitable transparent material and may include one or more non-reflective, anti-glare surfaces. The rear, recessed containing element 130 is in the general form of a shallow rectangular prism open on one large side. Containing element 130 is constructed from polystyrene, high-density polyethylene, or some similar substance. Containing element 130 may be manufactured using many different techniques, but conventional vacuum-forming technology is preferred. To ensure maximal structural rigidity of the device, a regular network of reinforcing depressions (as exemplified by 131) is formed in the back surface of containing element 130 except at the horizontal and vertical center point of the back surface of containing element 130 where a discontiguous planar mounting surface is retained. Evenly arranged within this mounting surface are a series of mounting holes 132 used to affix the enclosed flat panel display, or equivalent, to the wall or hanging mount supporting them. Those skilled in the art will recognize that the mounting holes provided on modern flat panel displays and mounts are arranged in standard patterns, with specific arrangements and dimensions being selected from a group referred to as the Flat Display Mounting Interface (FDMI) or more commonly the VESA mounting standard. Accordingly, one or more groups of mounting holes 132 are molded or otherwise formed in this planar mounting surface conforming to one or more patterns selected from this standard. Those skilled in the art will recognize that this standard may evolve over time and that future configurations are implicitly included in the spirit and scope of this disclosure.

Figure 3A:
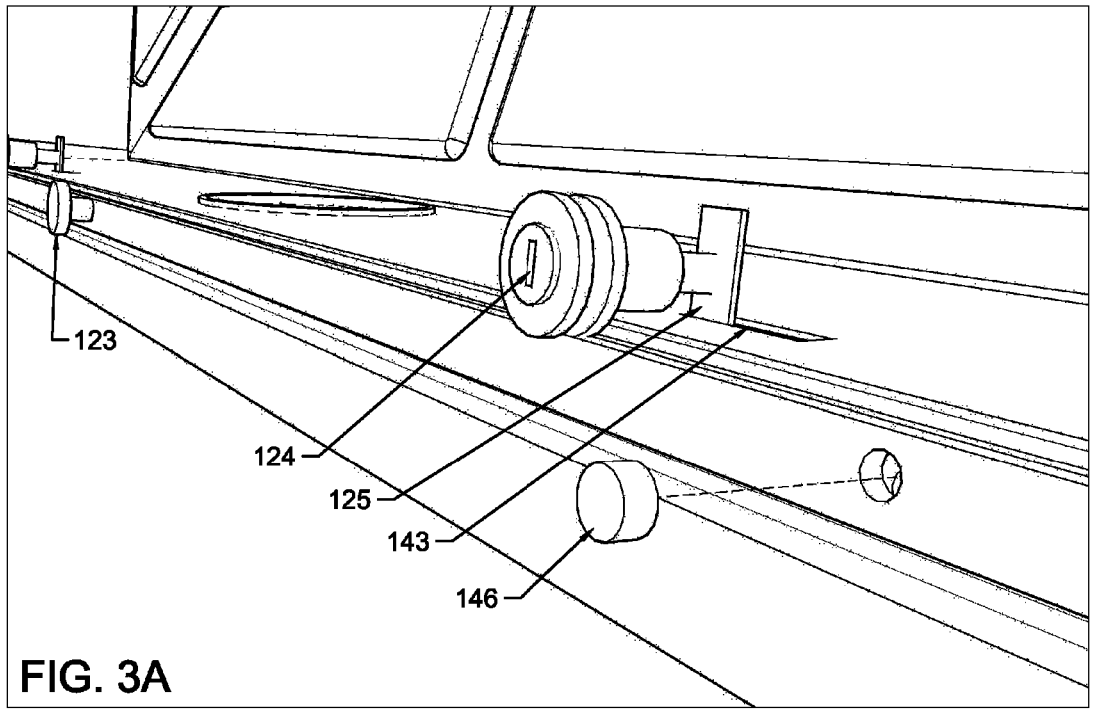
FIG. 3A illustrates a detail view of a compression latch as used in the preferred embodiment of the present invention.
Figure 3B:
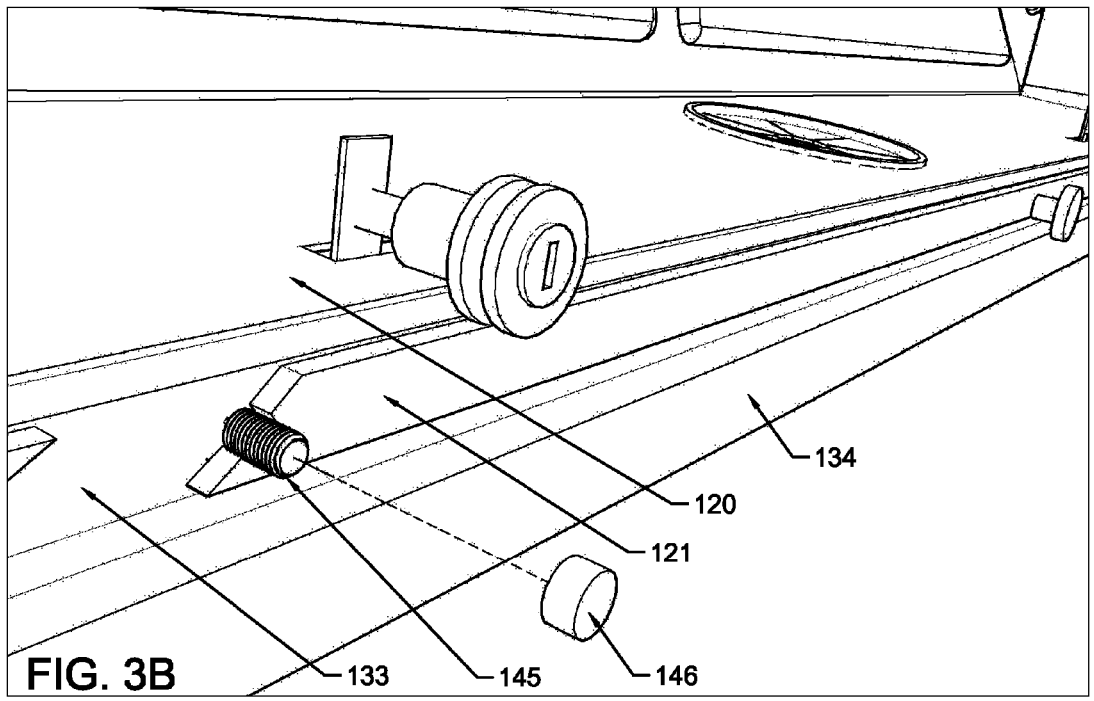
FIG. 3B illustrates a detail view of the double stepped flange extending outward from the containing element of the device, a partial cutaway view of the sealing strip and the one sealing screw and sealing cap used to secure the viewing element to the containing element.

Referring now to FIGS. 1 and 3B, extending outward at nearly a right angle from the top (open) edge of the four shallow walls thus formed in containing element 130 is a continuous, double stepped flange with lip. This flange has a lower, first surface 133 and a higher, second surface 134 situated above. Extending outward from higher, second surface 134 and bending down and over, is lip 135. Combined together, lower, first surface 133, higher, second surface 134, the stepped construction utilized to construct them, and lip 135 extending downward from higher, second surface 134 provide enhanced structural rigidity to containing element 130. Applied continuously to lower, first surface 133 of containing element 120 is sealing strip 121 comprised of rubber or some other elastomeric material. When protective enclosure 100 is closed and secured, sealing strip 121 is evenly compressed between lower, first surface 133 and viewing element 120. This helps ensure a weather tight seal.

Referring again to FIGS. 1 and 2, attached linearly to the top of higher, second surface 134 along the topmost of the two long edges of the recessed containing element 130 is hinging means 136. Hinging means 136 is used to affix viewing element 120 to containing element 130 in such a way that viewing element 120 may be swung up and away from containing element 130 so that the enclosed flat panel display may be accessed and manipulated. Since hinging means 136 is attached to the full length of higher, second surface 134 of the topmost of the two long edges of recessed containing element 130, hinging means 136 adds additional structural rigidity to containing element 130. To further add structural rigidity to containing element 130, attached linearly to the bottom of higher, second surface 134 along the full length of the topmost of the two long edges of the containing element 130, is lightweight reinforcing bar 137 constructed of steel, aluminum, or other suitable rigid material. Reinforcing bar 137 may be in any of a number of conventional shapes, including, but not limited to, a flat bar, an L-shaped angle bar, or a U-shaped bar. Hinging means 136 is affixed to reinforcing bar 137 by means a multiplicity of rivets 144, screws, or other attaching means passed through reinforcing bar 137, then through higher, second surface 134, then through hinging means 136.

Hingedly attached along the inner aspect of the left and right sides of viewing element 120 adjacent to the left and right edges of viewing element 120 are prop rods 122 or similar propping means. To hold viewing element 120 in the up, open position, the distal end of each prop rod 122 is inserted in a mating hole 138 drilled or otherwise formed in the higher, second surface 134 of the adjacent side wall of the containing element 130. When closed, prop rods 122 are positioned unobtrusively inside the sealed unit so that they do not interfere with the flat panel display.

At the center point of the lower, long shallow wall of recessed containing element 130, an access hole 139 is formed and into this access hole a rubber grommet 140 or equivalent is inserted such that necessary power, video, and data cables can unobtrusively exit from the bottom of the device to provide necessary interconnections with an external power source and other devices. Similarly, at the top of each of the shorter, side shallow walls of containing element 130 a vent hole 141 is formed or installed in containing element 130 thus allowing warm air to escape from the upper aspects of the device when a flat panel display is installed. Vent hole 141 may be louvered and oriented such that rain cannot enter the closed protective enclosure.

Referring now to FIGS. 1, 3A, and 3B along the bottom edge of viewing element 120 are one or more regularly spaced compression key latches 124, or similar locking means with locking tangs 125. The locking tangs 125 of compression key latches 124 interoperate with mating slots 143, molded indentations, or similar tang receiving means present in the bottom shallow wall of containing element 130. When viewing element 120 is closed against containing element 130 the user actuates compression key latch(es) 124 such that their tang(s) 125 interoperate with the mating slots 143 or molded indentations present in the bottom shallow wall of the containing element 130. By this means, the user may securely lock viewing element 120 to containing element 130 to prevent unauthorized tampering or theft of the enclosed flat panel display.

Referring now again to FIGS. 1 and 2, at the bottom edge of viewing element 120 are one or more regularly spaced knobs 123 or similar lifting means. Knob(s) 123 provide(s) a convenient means of manually lifting viewing element 120 up and away from containing element 130 into its fully propped position.

Referring now to FIGS. 2 and 3B, when viewing element 120 is closed on containing element 130, a series of regularly spaced holes drilled or otherwise formed through viewing element 120, sealing strip 121, and lower, first surface 133 concentrically align such that the threaded shaft of each sealing screw 145 affixed to the rear of lower, first surface 133 projects up and through lower, first surface 133, sealing strip 121, and viewing element 120. To seal viewing element 120 to containing element 130 and evenly compress sealing strip 121 between the two, threaded caps 146 or other sealing means are screwed onto the threaded ends of sealing screws 145 as they project above the plane of viewing element 120. By affixing threaded caps 146 to the projecting threaded ends of sealing screws 145, viewing element 120 is firmly secured to containing element 130 compressing sealing strip 121 between thus forming a hollow, rigid monocoque structure. This adds to the overall structural rigidity of protective enclosure 100 when closed and serves to limit the mechanical distortion of the unit when mounted thus improving weather-tightness and optical performance.

Referring again to FIG. 1, protective enclosure 100 can comprise many different materials. As discussed earlier, containing element 130 is preferably constructed of polystyrene or high-density polypropylene. Nevertheless, other materials are equally suitable. Acrylonitrile butadiene styrene, polyethylene terephthalate, and polycarbonate are all also suitable. Also, lightweight aluminum panels may be pressed into, and fiberglass may be molded into, equivalent shapes. Similarly, while viewing element 120 is ideally constructed of polycarbonate, other materials are suitable. Polyethylene terephthalate and laminated glass are but two examples.

In an alternative embodiment of the present invention, a multiplicity of light-emitting diodes may be regularly installed along the peripheral edge of the viewing element 120 or through lower first surface 133 and sealing strip 121, such that when illuminated the viewing element acts as a planar light guide and is illuminated with an even light of the same color as the light-emitting diodes. This is particularly useful when blue light-emitting diodes are installed due their ability to counter surface glare on a conventional polycarbonate sheet to glare in bright sunlight. Thus, the underlying flat panel display is rendered more easily visible in sunlit conditions. The electrical circuit illuminating the installed light emitting diodes may be controlled by a photodiode or other means of sensing ambient light levels and a modulating circuit so that the light-emitting diodes are on only when it is sunny and dynamically adjust in intensity as sun conditions change.

In an alternative embodiment of the present invention, a fan or other ventilating device is affixed to protective enclosure 100 to exhaust warm air from the interior of the device to the outside. This fan may be powered by any known means including but not limited to a direct electrical connection or by a battery and/or a solar cell.

In another alternative embodiment of the present invention, an active cooling and/or heating system may be affixed to protective enclosure 100 to maintain a relatively constant temperature or humidity inside the device. This active cooling and/or heating system may be of any known type including but not limited to, for example, Peltier devices and electric heating elements and may be powered by any known means including but not limited to a direct electrical connection or by a battery and/or a solar cell. Conventional external forced or refrigerated air cooling systems are well known in the art and are included herein by reference.

In an alternative embodiment of the present invention, one or more active or passive dehumidifying devices are included inside the device to dehumidify the interior of the device to help protect the flat panel display.

While the invention has been described in connection with what are considered to be the most practical and preferred embodiments, it is to be understood that the invention is not to be limited to the disclosed embodiments, but on the contrary is intended to cover various modifications and equivalent arrangements included within the spirit and scope of the disclosure. More specifically: 1) Variants that alter the number or arrangement of depressions formed in the back panel of the containing element; and/or, 2) Variants that seek to change the overall shape of the device, from its present shallow rectangular prism form to another form; and/or, 3) Variants that seek to enclose a multiplicity of flat panel displays in a single enclosure; and/or, 4) Variants that seek to provide a lightweight external supporting framework or structure coupled with a recessed containing element constructed of reinforced or unreinforced lightweight plastic material; and/or, 5) Variants that provide an integral sun-shade, rain shade, or similar device either attached to, or integral with, the present invention to further protect the enclosed display are included within the spirit and scope of the disclosure.

What is claimed is:

1. An improved all-weather enclosure for flat panel displays, comprising:

a) a water impervious containing element used to enclose a flat panel digital display;
  i. wherein said containing element is in the general form of a shallow, open rectangular prism comprised of: a back surface generally disposed horizontally along its longer dimension; left and right side short walls; and top and bottom short walls;
  ii. wherein extending outward at nearly a right angle from the free edge of each of said left, right, top, and bottom side short walls is a continuous, double stepped flange having a lower, first surface, a higher, second surface, and a lip;
  iii. wherein said containing element has a multiplicity of reinforcing depressions formed into said back surface and said left, right, top, and bottom side short walls;
  iv. wherein the center part of said back surface of said containing element contains at least one set of mounting holes the arrangement and spacing of which are selected from an industry standard group referred to as the Flat Display Mounting Interface (FDMI);
  v. wherein at least two regularly spaced first perforate holes are formed through said lower, first surface extending outward from each of said left, right, and bottom side short walls;
  vi. wherein said sealing strip has second perforate holes formed through said sealing strip such that said second perforate holes are equal in number to, and concentric with, said first perforate holes when said sealing strip is continuously affixed to the top of said lower first surface;
  vii. wherein a multiplicity of sealing screws are affixed to the back of said lower, first surface such that the threaded shaft of one of said sealing screws projects up and through each of said first perforate holes and adjacent, concentric second perforate holes;
b) a substantially transparent rectangular viewing element;
  i. wherein said viewing element is hingedly connected along its longer, top edge to said higher, second surface of said double stepped flange extending outward at nearly a right angle from the free edge of said top, side short wall such that when said viewing element is closed over said containing element the peripheral edges of said viewing element align with said lip of said double stepped flange and said sealing strip is squeezed between said viewing element and said lower, first surface of said double stepped flange;
  ii. wherein said viewing element has third perforate holes formed through said viewing element such that said third perforate holes are equal in number to, and concentric with, said first perforate holes, said second perforate holes, and said sealing screws when said viewing element is closed on said containing element;
  iii. wherein the threaded ends of said sealing screws extend up and though said third perforate holes formed in said viewing element when said viewing element is closed on said containing element;
  iv. wherein a sealing means is screwably affixed to the end of the threaded shaft of each of said sealing screws extending up and through said third perforate holes formed in said viewing element when said viewing element is closed on said containing element;
c) at least one propping means hingedly attached to the inner aspect of said viewing element adjacent to one lateral edge of said viewing element;
  i. wherein the distal, unattached end of said propping means may be inserted into a hole formed in the adjacent said higher, second surface of said double stepped flange extending outward at nearly a right angle from the free edge of said adjacent side short walls such that said viewing element may be stowed up and away from said containing element;
d) at least one lifting means attached along the bottom edge of the top surface of said viewing element;
e) at least one locking means with rotating tang extending through the bottom edge of said viewing element wherein said rotating tang interoperates with a tang receiving means mounted on the adjacent inside aspect of said bottom short side wall.

2. An improved all-weather enclosure for flat panel displays of claim 1, further comprising at least one air vent.

3. An improved all-weather enclosure for flat panel displays of claim 1, further comprising at least one access hole for cables.

4. An improved all-weather enclosure for flat panel displays of claim 1, further comprising at least one reinforcing bar attached to the back of said higher, second surface of said double stepped flange attached to said top, short wall.

5. An improved all-weather enclosure for flat panel displays of claim 1, further comprising a cooling fan.

6. An improved all-weather enclosure for flat panel displays of claim 1, further comprising an active cooling system.

7. An improved all-weather enclosure for flat panel displays of claim 1, further comprising an active heating system.

8. An improved all-weather enclosure for flat panel displays of claim 1, further comprising both an active cooling system and an active heating system.

9. An improved all-weather enclosure for flat panel displays of claim 1, further comprising an active dehumidifying system.

10. An improved all-weather enclosure for flat panel displays of claim 1, further comprising a passive dehumidifying system.

11. The enclosure of claim 1, further including indentations in a back portion of the containing element configured to provide additional rigidity to the back portion.

12. The enclosure of claim 1, further comprising a group of holes in the containing element sized and spaced in accordance with an industry-standard known as the Flat Display Mounting Interface (FDMI).

13. The enclosure of claim 1 further comprising a hinge attaching the transparent viewing element to the containing element and a reinforcing bar located on the containing element to which the hinge also attaches.

14. The enclosure of claim 13, wherein the hinge is a piano style hinge.

15. An enclosure for an electronic device comprising: a containing element generally rectangular in shape having a back portion, a top portion, a bottom portion and side portions, wherein the top portion, the bottom portion, and the side portions extend away from the back portion and define a containing space; a substantially transparent viewing element pivotally attached to the top portion of the containing element wherein the viewing element is configured to cover the containing space when the viewing element is pivoted to a closed position; a resilient seal located between the top portion, bottom portion, side portions and the viewing element when the viewing element is in the closed position; vents located in at least one of the top, bottom, and side portions configured to permit air to flow between the containing space and space outside the enclosure; and a grommet located in at least one of the top, bottom, and side portions configured to permit electrical cords to pass between the containing space and space outside of the enclosure and further comprising a lock configured to lock the viewing element in the closed position.

16. The enclosure of claim 15, wherein the vents include louvers that are adjustable.

17. The enclosure of claim 15, wherein the top portion, bottom portion, and side portions have front portions that define a groove and the resilient seal is located in the groove and the viewing element is dimensioned so that when the viewing element is in a closed position, the seal and the viewing element will fill the groove so that a top surface of the viewing element will be substantially coplanar with a front surface of the top portion, bottom portion, and side portions of the containing element.

18. A method of enclosing an electronic display device comprising: forming a containing element generally rectangular in shape having a back portion, a top portion, a bottom portion and side portions, wherein the top portion, the bottom portion, and the side portions extend away from the back portion and define a containing space; pivotally attaching a substantially transparent viewing element to the top portion of the containing element wherein the viewing element is configured to cover the containing space when the viewing element is pivoted to a closed position; configuring the top portion, bottom portion, side portions to seal to the viewing element when the viewing element is in the closed position; and providing a grommet located in at least one of the top, bottom, and side portions configured to permit electrical cords to pass between the containing space and space outside of the enclosure and further comprising mounting the electronic display device to a bracket located outside of the containing element via a fasteners that extend from the bracket through the containing element to the electronic display device.

* * * * *